US00RE42849E

(19) United States
(12) Reissued Patent
Duineveld et al.

(10) Patent Number: US RE42,849 E
(45) Date of Reissued Patent: Oct. 18, 2011

(54) LITHOGRAPHIC APPARATUS AND DEVICE MANUFACTURING METHOD

(75) Inventors: Paulus Cornelis Duineveld, Drachten (NL); Peter Dirksen, Valkenswaard (NL); Aleksey Yurievich Kolesnychenko, Helmond (NL); Helmar Van Santen, Amsterdam (NL)

(73) Assignee: ASML Netherlands B.V., Veldhoven (NL)

(21) Appl. No.: 12/153,717

(22) Filed: May 22, 2008

Related U.S. Patent Documents

Reissue of:
(64) Patent No.: 7,050,146
Issued: May 23, 2006
Appl. No.: 10/773,461
PCT Filed: Feb. 9, 2004

(51) Int. Cl.
*G03B 27/52* (2006.01)
*G03B 27/42* (2006.01)

(52) U.S. Cl. ..... 355/30; 355/53

(58) Field of Classification Search ..... 355/30, 355/53, 67, 72, 73; 430/30, 33, 311, 322; 356/128, 344; 250/236, 288
See application file for complete search history.

(56) References Cited

U.S. PATENT DOCUMENTS

| | | | | |
|---|---|---|---|---|
| 3,527,684 | A | 9/1970 | Jarvis et al. | 430/32 |
| 3,573,975 | A | 4/1971 | Dhaka et al. | 117/212 |
| 3,648,587 | A | 3/1972 | Stevens | 95/44 |
| 4,013,554 | A | 3/1977 | Reis et al. | 210/670 |
| 4,346,164 | A | 8/1982 | Tabarelli et al. | 430/311 |
| 4,390,273 | A | 6/1983 | Loebach et al. | 355/125 |
| 4,396,705 | A | 8/1983 | Akeyama et al. | 430/326 |
| 4,480,910 | A | 11/1984 | Takanashi et al. | 355/30 |
| 4,509,852 | A | 4/1985 | Tabarelli et al. | 355/30 |
| 4,569,739 | A | 2/1986 | Klinkowski | 204/517 |
| 5,040,020 | A | 8/1991 | Rauschenbach et al. | 355/53 |
| 5,121,256 | A | 6/1992 | Corle et al. | 359/664 |
| 5,223,331 | A | 6/1993 | Ogawa et al. | 428/209 |
| 5,289,001 | A | 2/1994 | Arimoto et al. | 250/236 |
| 5,610,683 | A | 3/1997 | Takahashi | 355/53 |
| 5,715,039 | A | 2/1998 | Fukuda et al. | 355/53 |
| 5,825,043 | A | 10/1998 | Suwa | 250/548 |
| 5,900,354 | A | 5/1999 | Batchelder | 430/395 |
| 6,191,429 | B1 | 2/2001 | Suwa | 250/548 |
| 6,207,331 | B1 | 3/2001 | Akutsu et al. | 430/33 |
| 6,236,634 | B1 | 5/2001 | Lee et al. | 369/112 |
| 6,413,401 | B1 | 7/2002 | Chow et al. | 204/602 |
| 6,496,257 | B1 | 12/2002 | Taniguchi et al. | 356/239.2 |

(Continued)

FOREIGN PATENT DOCUMENTS

DE 206 607 2/1984

(Continued)

OTHER PUBLICATIONS

English Translation of JP 06-262005 (dated Sep. 20, 1994).*

(Continued)

*Primary Examiner* — Hung Henry Nguyen
(74) *Attorney, Agent, or Firm* — Pillsbury Winthrop Shaw Pittman LLP

(57) ABSTRACT

An immersion lithographic apparatus includes a voltage generator or power source that applies a potential difference to an object in contact with the immersion liquid such that bubbles and/or particles in the immersion liquid are either attracted or repelled from that object due to the electrokinetic potential of the surface of the bubble in the immersion liquid.

45 Claims, 3 Drawing Sheets

U.S. PATENT DOCUMENTS

| | | | | |
|---|---|---|---|---|
| 6,560,032 | B2 | 5/2003 | Hatano | 359/656 |
| 6,600,547 | B2 | 7/2003 | Watson et al. | |
| 6,603,130 | B1 | 8/2003 | Bisschops et al. | 250/492.1 |
| 6,633,365 | B2 | 10/2003 | Suenaga | 355/53 |
| 6,952,253 | B2 | 10/2005 | Lof et al. | 355/30 |
| 6,954,256 | B2 | 10/2005 | Flagello et al. | 355/53 |
| 7,006,209 | B2 * | 2/2006 | Levinson | 356/128 |
| 7,009,682 | B2 | 3/2006 | Bleeker | 355/53 |
| 7,014,966 | B2 * | 3/2006 | Pawloski et al. | 430/30 |
| 7,050,146 | B2 | 5/2006 | Duineveld et al. | 355/30 |
| 7,075,616 | B2 | 7/2006 | Derksen et al. | 355/30 |
| 7,081,943 | B2 | 7/2006 | Lof et al. | 355/30 |
| 7,091,502 | B2 | 8/2006 | Gau et al. | 250/492.2 |
| 7,193,232 | B2 | 3/2007 | Lof et al. | 250/559.29 |
| 7,199,858 | B2 | 4/2007 | Lof et al. | 355/30 |
| 7,213,963 | B2 | 5/2007 | Lof et al. | 366/53 |
| 7,224,427 | B2 | 5/2007 | Chang et al. | 355/30 |
| 7,224,434 | B2 | 5/2007 | Tokita | 355/53 |
| 7,307,263 | B2 | 12/2007 | Bakker et al. | 250/492.2 |
| 7,317,504 | B2 | 1/2008 | De Smit et al. | 355/30 |
| 7,326,522 | B2 | 2/2008 | Dierichs | 430/311 |
| 7,359,030 | B2 | 4/2008 | Simon et al. | 355/30 |
| 7,385,670 | B2 | 6/2008 | Compen et al. | 355/30 |
| 7,394,521 | B2 | 7/2008 | Van Santen et al. | 355/53 |
| 7,405,417 | B2 | 7/2008 | Stevens et al. | 250/504 R |
| 7,462,850 | B2 | 12/2008 | Banine et al. | 250/504 R |
| 2002/0020821 | A1 | 2/2002 | Van Santen et al. | 250/492 |
| 2002/0163629 | A1 | 11/2002 | Switkes et al. | 355/53 |
| 2003/0123040 | A1 | 7/2003 | Almogy | 355/69 |
| 2003/0136668 | A1 | 7/2003 | Kobata et al. | 204/242 |
| 2003/0174408 | A1 | 9/2003 | Rostalski et al. | 359/642 |
| 2004/0000627 | A1 | 1/2004 | Schuster | |
| 2004/0017989 | A1 | 1/2004 | So | 385/129 |
| 2004/0021844 | A1 | 2/2004 | Suenaga | |
| 2004/0036019 | A1 | 2/2004 | Goodley et al. | 250/288 |
| 2004/0075895 | A1 | 4/2004 | Lin | 359/380 |
| 2004/0109237 | A1 | 6/2004 | Epple et al. | |
| 2004/0119954 | A1 | 6/2004 | Kawashima et al. | 355/30 |
| 2004/0125351 | A1 | 7/2004 | Krautschik et al. | 355/53 |
| 2005/0024609 | A1 | 2/2005 | De Smit et al. | 355/18 |
| 2005/0037269 | A1 * | 2/2005 | Levinson | 430/30 |
| 2005/0110973 | A1 | 5/2005 | Streefkerk et al. | 355/67 |
| 2005/0132914 | A1 | 6/2005 | Mulkens et al. | 101/463.1 |
| 2005/0175776 | A1 | 8/2005 | Streefkerk et al. | 427/256 |
| 2005/0264774 | A1 | 12/2005 | Mizutani et al. | 355/30 |
| 2005/0274898 | A1 | 12/2005 | Watanabe et al. | 250/372 |
| 2006/0023185 | A1 | 2/2006 | Hazelton et al. | 355/53 |
| 2006/0050351 | A1 | 3/2006 | Higashiki | 359/228 |
| 2006/0103818 | A1 | 5/2006 | Holmes et al. | 355/53 |
| 2006/0132731 | A1 | 6/2006 | Jansen et al. | 355/30 |
| 2006/0232757 | A1 | 10/2006 | Tani et al. | 355/53 |
| 2006/0256316 | A1 | 11/2006 | Tanno et al. | 355/72 |
| 2007/0064215 | A1 | 3/2007 | Dirksen et al. | 355/77 |
| 2007/0127001 | A1 | 6/2007 | Van Der Hoeven | 355/53 |
| 2007/0146657 | A1 | 6/2007 | Van Mierlo et al. | 355/30 |
| 2007/0146658 | A1 | 6/2007 | Van Mierlo et al. | 355/30 |
| 2007/0159610 | A1 | 7/2007 | Shiraishi | 355/53 |
| 2007/0206279 | A1 | 9/2007 | Brueck et al. | 359/391 |
| 2007/0247600 | A1 | 10/2007 | Kobayashi et al. | 355/30 |
| 2007/0251543 | A1 | 11/2007 | Singh | 134/1 |
| 2007/0258072 | A1 | 11/2007 | Nagasaka et al. | 355/53 |
| 2007/0285631 | A1 | 12/2007 | Stavenga et al. | 355/30 |
| 2008/0002162 | A1 | 1/2008 | Jansen et al. | 355/30 |
| 2008/0049201 | A1 | 2/2008 | Stavenga et al. | 355/30 |
| 2008/0218712 | A1 | 9/2008 | Compen et al. | 355/30 |
| 2008/0273181 | A1 | 11/2008 | De Jong et al. | 355/30 |
| 2008/0284990 | A1 | 11/2008 | De Jong et al. | 355/30 |
| 2009/0025753 | A1 | 1/2009 | De Jong et al. | 134/10 |
| 2009/0027635 | A1 | 1/2009 | De Jong et al. | 355/30 |
| 2009/0027636 | A1 | 1/2009 | Leenders et al. | 355/30 |

FOREIGN PATENT DOCUMENTS

| | | | |
|---|---|---|---|
| DE | DD 206 607 | | 2/1984 |
| DE | 221 263 | | 4/1985 |
| DE | DD 221 563 | | 4/1985 |
| DE | 224448 | | 7/1985 |
| DE | 242880 | | 2/1987 |
| EP | 0023231 | | 2/1981 |
| EP | 0418427 | | 3/1991 |
| EP | 0605103 | A1 | 7/1994 |
| EP | 0834773 | A2 | 4/1998 |
| EP | 0 834 773 | A3 | 7/1999 |
| EP | 0834773 | A3 | 7/1999 |
| EP | 1039511 | | 9/2000 |
| FR | 2474708 | | 7/1981 |
| JP | 58-202448 | | 11/1983 |
| JP | 62-065326 | | 3/1987 |
| JP | 62-121417 | | 6/1987 |
| JP | 63-157419 | | 6/1988 |
| JP | 03-209479 | A | 9/1991 |
| JP | 04-305915 | | 10/1992 |
| JP | 04-305917 | | 10/1992 |
| JP | 06-124873 | | 5/1994 |
| JP | 06-168866 | A | 6/1994 |
| JP | 06-262005 | A | 9/1994 |
| JP | 07-132262 | | 5/1995 |
| JP | 07-220990 | | 8/1995 |
| JP | 10-78649 | | 3/1998 |
| JP | 10-228661 | | 8/1998 |
| JP | 10-255319 | | 9/1998 |
| JP | 10-303114 | | 11/1998 |
| JP | 10-340846 | | 12/1998 |
| JP | 11-176727 | | 7/1999 |
| JP | 2000-058436 | | 2/2000 |
| JP | 2000-162761 | A | 6/2000 |
| JP | JP2000-323396 | | 11/2000 |
| JP | 2001-091849 | | 4/2001 |
| JP | 2004-193252 | | 7/2004 |
| JP | 2005-072404 | | 3/2005 |
| JP | 2005-079222 | | 3/2005 |
| JP | 2006-134999 | | 5/2006 |
| WO | WO 99/49504 | | 9/1999 |
| WO | WO 03/077036 | | 9/2003 |
| WO | WO 03/077037 | | 9/2003 |
| WO | WO 2004/019128 | | 3/2004 |
| WO | WO 2004/053596 | A2 | 6/2004 |
| WO | WO 2004/053950 | A1 | 6/2004 |
| WO | WO 2004/053951 | A1 | 6/2004 |
| WO | WO 2004/053952 | A1 | 6/2004 |
| WO | WO 2004/053953 | A1 | 6/2004 |
| WO | WO 2004/053954 | A1 | 6/2004 |
| WO | WO 2004/053955 | A1 | 6/2004 |
| WO | WO 2004/053956 | A1 | 6/2004 |
| WO | WO 2004/053957 | A1 | 6/2004 |
| WO | WO 2004/053958 | A1 | 6/2004 |
| WO | WO 2004/053959 | A1 | 6/2004 |
| WO | WO 2004/055803 | A1 | 7/2004 |
| WO | WO 2004/057589 | A1 | 7/2004 |
| WO | WO 2004/057590 | A1 | 7/2004 |
| WO | WO 2005/122218 | | 12/2005 |
| WO | WO 2006/041086 | | 4/2006 |
| WO | WO 2006/062065 | | 6/2006 |

OTHER PUBLICATIONS

Notice of Reasons for Rejection for Japanese Patent Application No. 2005-030038 dated Jun. 2, 2008.

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21, 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.
G. Owen et al., "⅛ μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International Sematech, Los Angeles, Jan. 27-29, 2004, Slide Nos. 1-51.
H. Hata, "The Development of Immersion Exposure Tools", Litho Forum, International Sematech, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $\kappa_3$ coefficient in nonparaxial $\lambda$/NA scaling equations for resolution, depth of focus, and immersion lithography, *J. Microlith., Microfab., Microsyst*. 1(1):7-12 (2002).
European Search Report for EP Application No. 05250691.2, dated May 18, 2005.
U.S. Appl. No. 10/820,227, filed Apr. 8, 2004, De Smit.
U.S. Appl. No. 10/860,662, filed Jun. 4, 2004, De Smit.
U.S. Appl. No. 10/773,461, filed Feb. 9, 2004, Duineveld et al.
U.S. Appl. No. 10/698,012, filed Oct. 31, 2003, Flagello et al.
U.S. Appl. No. 10/705,804, filed Nov. 12, 2003, De Smit et al.
U.S. Appl. No. 10/705,805, filed Nov. 12, 2003, Lof et al.
U.S. Appl. No. 10/705,783, filed Nov. 12, 2003, Lof et al.
U.S. Appl. No. 10/743,271, filed Dec. 23, 2003, Van Santen et al.
U.S. Appl. No. 10/743,266, filed Dec. 23, 2003, Mulkens et al.
U.S. Appl. No. 10/705,785, filed Nov. 12, 2003, Derksen et al.
U.S. Appl. No. 10/724,402, filed Dec. 1, 2003, Simon et al.
U.S. Appl. No. 10/715,116, filed Nov. 18, 2003, Bleeker.
U.S. Appl. No. 10/719,683, filed Nov. 24, 2003, Streekerk et al.
U.S. Appl. No. 10/705,816, filed Nov. 12, 2003, Lof et al.
U.S. Appl. No. 10/775,326, filed Feb. 11, 2004, Dierichs.
U.S. Appl. No. 10/857,614, filed Jun. 1, 2004, Lof et al.
U.S. Appl. No. 10/367,910, filed Feb. 19, 2003, Suwa et al.

* cited by examiner

LITHOGRAPHIC APPARATUS AND DEVICE MANUFACTURING METHOD

Matter enclosed in heavy brackets [ ] appears in the original patent but forms no part of this reissue specification; matter printed in italics indicates the additions made by reissue.

*More than one reissue application has been filed for the reissue of Pat. No. 7,050,146. The reissue applications are continuation reissue application No. 13/214,955 and parent reissue application No. 12/153,717 (the present application), all of which are reissue applications of Pat. No. 7,050,146.*

BACKGROUND OF THE INVENTION

1. Field of the Invention

The present invention relates to a lithographic apparatus and a device manufacturing method.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g. including part of one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning" direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. This enables imaging of smaller features because the exposure radiation will have a shorter wavelength in the liquid. (The effect of the liquid may also be regarded as increasing the effective NA of the system and also increasing the depth of focus.)

However, submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504. As illustrated in FIGS. 2 and 3, liquid is supplied by at least one inlet IN onto the substrate W, preferably along the direction of movement of the substrate relative to the final element, and is removed by at least one outlet OUT after having passed under the projection system PL. That is, as the substrate is scanned beneath the final element in a −X direction, liquid is supplied at the +X side of the final element and taken up at the −X side. FIG. 2 shows the arrangement schematically in which liquid is supplied via inlet IN and is taken up on the other side of the element by outlet OUT which is connected to a low pressure source. In the illustration of FIG. 2, the liquid is supplied along the direction of movement of the substrate relative to the final element, though this does not need to be the case. Various orientations and numbers of in- and out-lets positioned around the final element are possible. One example is illustrated in FIG. 3 in which four sets of an inlet with an outlet on either side are provided in a regular pattern around the final element.

Another solution which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. Preferably the seal is a contactless seal such as a gas seal. Such a system is disclosed in European Patent Application No. 03252955.4 hereby incorporated in its entirety by reference.

Other types of seal members are clearly possible including those with different arrangements of inlets and outlets and also those which are asymmetric.

A difficulty in immersion lithography has been found to be the existence of bubbles in the immersion liquid. These bubbles can be of any size, but bubbles of the order of a few μm have presented a particular problem. This is especially the case when the μm bubbles lie on the surface of the substrate or a sensor which is to be imaged because in this position the bubbles have a maximum disturbing influence on the projection beam.

SUMMARY OF THE INVENTION

It is an aspect of the present invention to reduce the effect of bubbles in immersion liquid on the imaging quality in immersion lithography.

According to an aspect of the present invention, there is provided a lithographic apparatus including an illumination system configured to provide projection beam of radiation; a support configured to support a patterning structure, the patterning structure configured to impart the projection beam with a pattern in its cross-section; a substrate table configured to hold a substrate; a projection system configured to project the patterned beam onto a target portion of the substrate; a liquid supply system configured to at least partly fill a space between a final element of the projection system and the substrate with an immersion liquid; and a power source configured to apply a first electrical potential to a first object effective to move bubbles and/or particles in the immersion liquid.

In this way, it is possible to apply a force on bubbles in the immersion liquid in a direction either towards or away from the first object. This is because bubbles in the immersion liquid will have a natural electrokinetic potential which is a potential difference between the surface of the bubble and the fully dissociated ionic concentration in the body of the liquid. Thus, by choosing the first electrical potential to be either the same or opposite polarity to the electrokinetic potential of the bubble it can be determined whether the bubble moves towards or away from the first object. Thus, this system can be used to move bubbles in the immersion liquid to places where their effect on the imaging quality of the apparatus is minimized. The present invention works in the same way on small particles as it does on bubbles.

Preferably, the first object forms a border of the space so that the positions of the bubbles in the immersion liquid in the space can be controlled. Alternatively, the first object can be in contact with the immersion liquid in a supply channel upstream of the space. In this way it is possible to avoid the generation of excessive electrical potential fields in the space which might be deleterious to sensors in the space or might be difficult to arrange for because of the limited space for objects under the projection system.

It is desirable to have a second power source or voltage to apply a second electrical potential to a second object in contact with the immersion liquid. In this way, the force on the bubbles may be increased as the first electrical potential could be made effective to repel the bubbles whilst the second electrical potential could be made effective to attract the bubbles, or vice versa.

In one embodiment, the substrate can be made to be the first object so that bubbles can be repelled from the substrate itself. In another embodiment, the second object can be the final element of the projection system so that bubbles can be attracted towards that and thereby away from the substrate. The first and second objects may be the other way round.

In another embodiment, the first object still forms a border of the space but is positioned distal from the optical axis of the apparatus. In this way bubbles can be moved away from the optical axis of the apparatus so that the liquid through which imaging is actually taking place is substantially free of bubbles.

According to a further aspect of the present invention, there is provided a device manufacturing method including projecting a patterned beam of radiation onto a target portion of a substrate using a projection system; providing an immersion liquid between a final element of the projection system and the substrate; and applying a force on bubbles in the immersion liquid by applying a charge to an object in contact with the immersion liquid.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. One of ordinary skill will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning structure" used herein should be broadly interpreted as referring to a structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning structures may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned. In each example of a patterning structure, the support structure may be a frame or table, for example, which may be fixed or movable as required and which may ensure that the patterning structure is at a desired position, for example with respect to the projection system. Any use of the terms, "reticle" or "mask" herein may be considered synonymous with the more general term "patterning structure".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
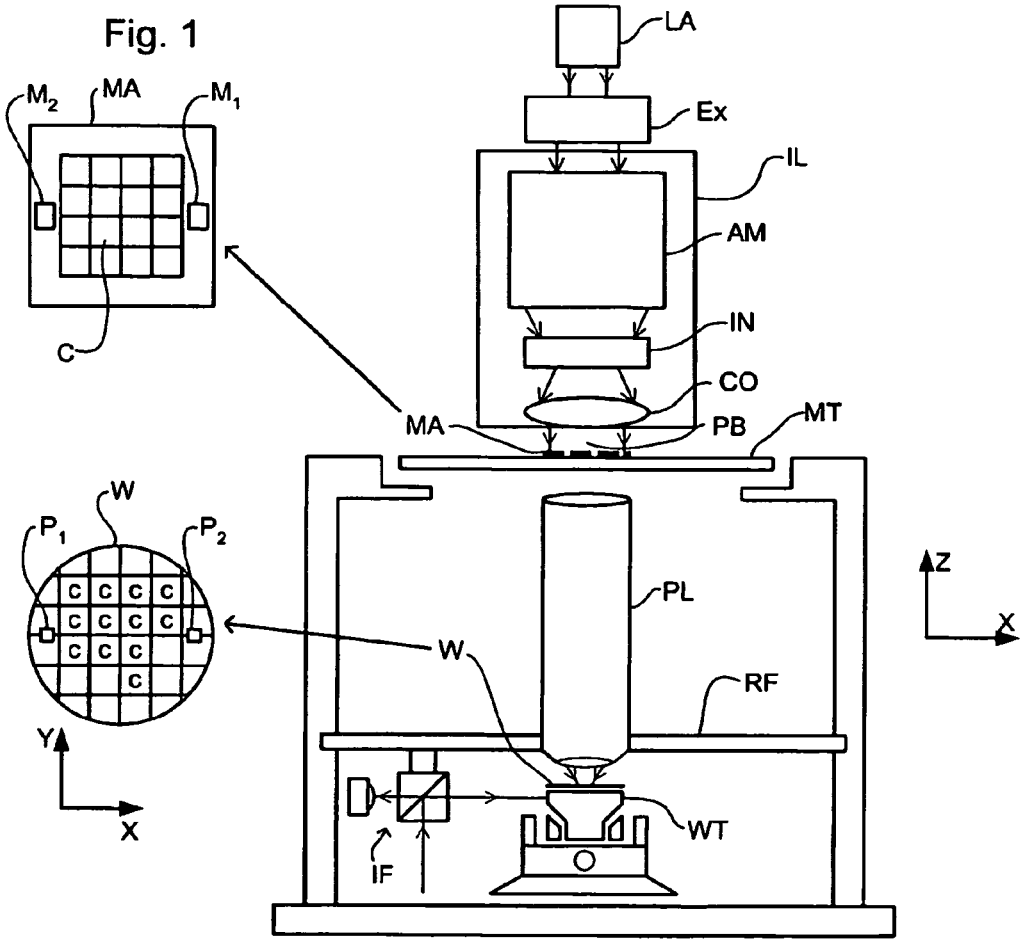
FIG. 1 depicts a lithographic apparatus according to an embodiment of the invention.

FIG. 1 schematically depicts a lithographic apparatus according to a particular embodiment of the invention. The apparatus includes an illumination system (illuminator) IL for providing a projection beam PB of radiation (e.g. UV radiation). A first support structure (e.g. a mask table) MT is configured to support a patterning structure (e.g. a mask) MA and is connected to a first positioning device PM that accurately positions the patterning structure with respect to a projection system. A substrate table (e.g. a wafer table) WT is configured to hold a substrate (e.g. a resist-coated wafer) W and is connected to a second positioning device PW that accurately positions the substrate with respect to the projection system. The projection system (e.g. a refractive projection lens) PL images a pattern imparted to the projection beam PB by the patterning structure MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source LA. The source and the lithographic apparatus may be separate entities, for example when the source is an excimer laser. In such cases, the source is not considered to form part of the lithographic apparatus and the radiation beam is passed from the source LA to the illuminator IL with the aid of a beam delivery system Ex including, for example, suitable directing mirrors and/or a beam expander. In other cases, the source may be an integral part of the apparatus, for example when the source is a mercury lamp. The source LA and the illuminator IL, together with the beam delivery system Ex if required, may be referred to as a radiation system.

The illuminator IL may include an adjusting device AM to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and a position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in a single "flash" (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structures, such as a programmable mirror array of a type as referred to above.

Combinations and/or variations on the above described modes of use or entirely different modes of use may also be employed.

The present invention is applicable to any type of liquid supply system. The supply system may be configured to supply any type of immersion liquid and may use any type of system for confining the immersion liquid between the projection system PL and the substrate W.

Figure 2:
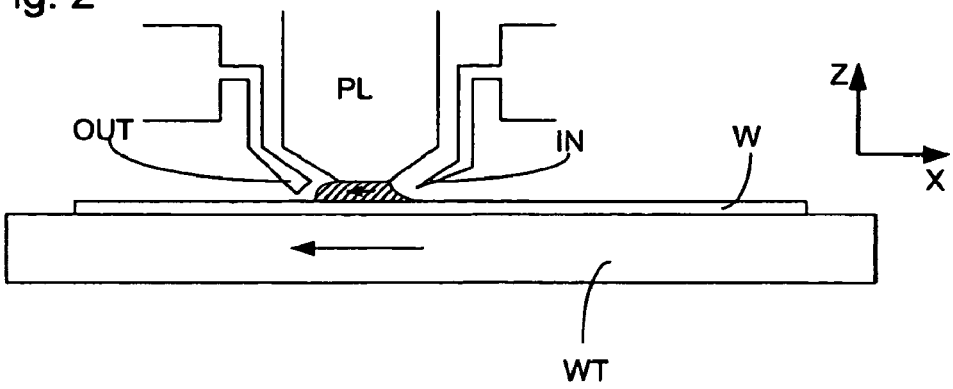
FIG. 2 illustrates, in cross-section, a liquid supply system.
Figure 3:
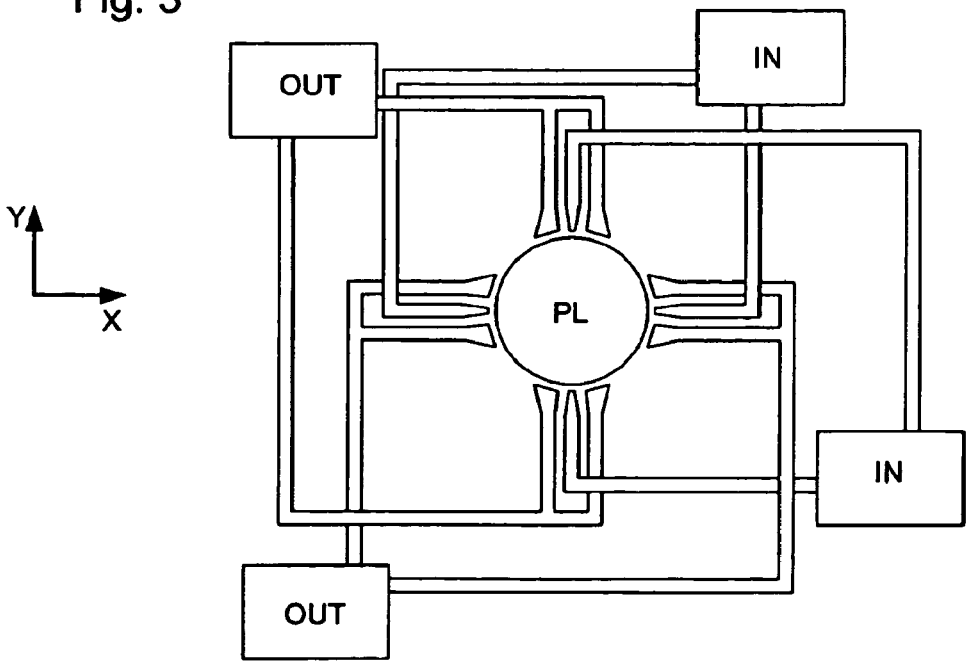
FIG. 3 illustrates the liquid supply system of FIG. 2.
Figure 4:
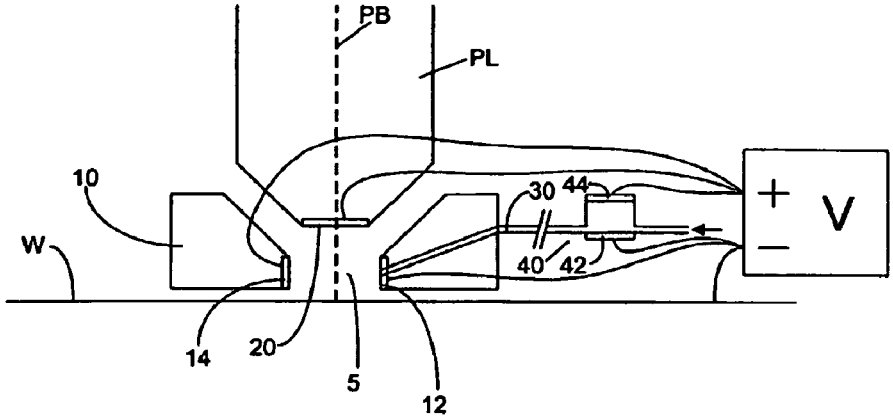
FIG. 4 illustrates an embodiment of the present invention.

FIG. 4 illustrates one type of liquid confinement system according to the present invention. The present invention could be applied to the liquid supply system of FIGS. 2 and 3.

The liquid supply system of FIG. 4 includes a barrier member 10 positioned below and surrounding the final element 20 of the projection system PL. The liquid is brought into the space 5 below the projection system and within the barrier member 10. The barrier member 10 preferably extends a little above the final element of the projection system PL. Optionally, a seal may be provided between the bottom of the barrier member 10 and the substrate W. This seal may, for example, be a gas seal or a hydrostatic seal. The barrier member 10 may be supported by the projection system PL or the base frame of the apparatus or in any other way including supporting its own weight on the substrate W.

Immersion liquid is supplied to the space between the projection system PL and the substrate W through a conduit 30. The immersion liquid is then removed from the space. This removal of liquid is not illustrated but may be in any way, for example by a low pressure source.

Micro bubbles and small particles can be present in the immersion liquid and, if these are close to the surface of the substrate W during imaging, can deleteriously effect the quality of the projected image and the resulting product. The present invention addresses this issue drawing on the discovery made by the mining industry that small solid particles adhere to bubble surfaces in a liquid. It was found that electrical forces between micron size bubbles and the solid particles play an important role in the adhesion. It was found that bubbles in a liquid have, on their surface, an electrokinetic (or zeta) potential which results in a potential difference between the surface of the bubble and the fully disassociated ionic concentration in the body of the liquid. This also applies to small particles.

In the present invention, a power source or voltage supply V (or charge, voltage, electrical field or potential difference generator or supply) is used to apply an electrical potential to one or more objects of the immersion apparatus. The principle of operation is that if repulsion is required a potential difference between the fully disassociated ionic concentration of the liquid and the object is generated, which is of the same polarity as the potential difference between the fully disassociated ionic concentration in the body of the liquid and the surface of the bubble. If attraction between the object and the bubble is required the potential differences should have opposite polarity. In this way forces can be generated on the bubbles towards or away from the objects (e.g. electrodes) which are in contact with the immersion liquid.

In FIG. 4 several different objects have a potential or charge applied to them. The present invention will work with only one such object and also with any combination of objects, and indeed other objects not illustrated could be also or alternatively used.

In pure water, which is a candidate for use as an immersion liquid at 193 nm projection beam wavelength, it has been found that the surface potential of μm bubbles is about −50 mV. This potential will vary with bubble size and also with type of immersion liquid. However, the same principles as described here can be used for other immersion liquids and bubble sizes and the invention is fully applicable to those. Additives may be added to the immersion liquid to change the effect of the surface potential. $CaCl_2$ and NaCl are suitable additives for this purpose.

In FIG. 4, six different objects are illustrated to which a potential or voltage or charge could be applied. Preferably the objects are in contact with the immersion liquid, though in principle this is not necessary. One of these objects is the substrate W which is preferably charged to the same polarity of electrical potential as the electrical potential of the surface of the bubbles. In this way the bubbles have a force on them directly away from the substrate W so that their effect on the projected image is minimized. In combination with a negative potential on the substrate W, or by itself, the final element of the projection system or an object close to the final element 20 of the projection system PL can be charged to a potential opposite in polarity to the potential of the surface of the bubbles. This will have the effect of attracting the bubbles towards the final element 20 of the projection system PL and thereby away from the substrate W. The shape of the object (e.g., electrode) close to the final element 20 of a projection system PL could be any shape. It could be plate-like or annular so that the projection beam PB passes through the center of the object.

Alternatively, the objects to be charged or have a voltage applied to them could be attached to a surface of the barrier member 10. In FIG. 4, these objects are attached to the inner surface of the barrier member 10. As illustrated, two electrodes 12, 14 are present each on opposite sides of the barrier member and charged to opposite potentials. In this way the bubbles could be drawn to one or other of the electrodes 12, 14, perhaps in the direction of an immersion liquid outlet. Alternatively, one object or more objects may be provided around the inner side of the seal member 10 (in contact with the immersion liquid) which is/are charged to a potential with a polarity different to the polarity of the potential of the surface of the bubbles. In this way bubbles in the immersion liquid in the space 5 between the final element 20 of the projection system PL and the substrate W will be drawn away from the optical axis of the apparatus thereby leaving the path of the projection beam PB to the substrate W substantially unhindered by bubbles.

Another place to use the present invention is upstream of the space 5 between the final element 20 of the projection system PL and the substrate W in the liquid supply system. In this case, as the immersion liquid passes along conduits 30 and through a housing 40, oppositely charged and opposing plates (e.g., electrodes) 42, 44 produce a force on the bubbles which is effective to move the bubbles, when the immersion liquid is in the space 5, further away from the substrate W than they would be without the application of the electrical field upstream of the space 5. The immersion liquid with a high concentration of bubbles, i.e. near the electrode 44, could even be removed and not supplied to the space 5. The removed liquid could be subjected to a bubble removal process before being recycled in the liquid supply system.

In all of the above examples, the higher the voltage applied by the voltage generator V the greater the force on the bubbles. The potential on the objects should not be so high as to cause disassociation of the immersion liquid but should be high enough to provide a force on the bubbles such that the present invention is effective. For an immersion liquid comprised mainly of water, typical potential differences applied to the objects are 5 mV to 5V, preferably 10 mV to 500 mV. An electrical field of 5 mV/mm to 500 mV/mm due to the application of the potential is preferred.

Figure 5:
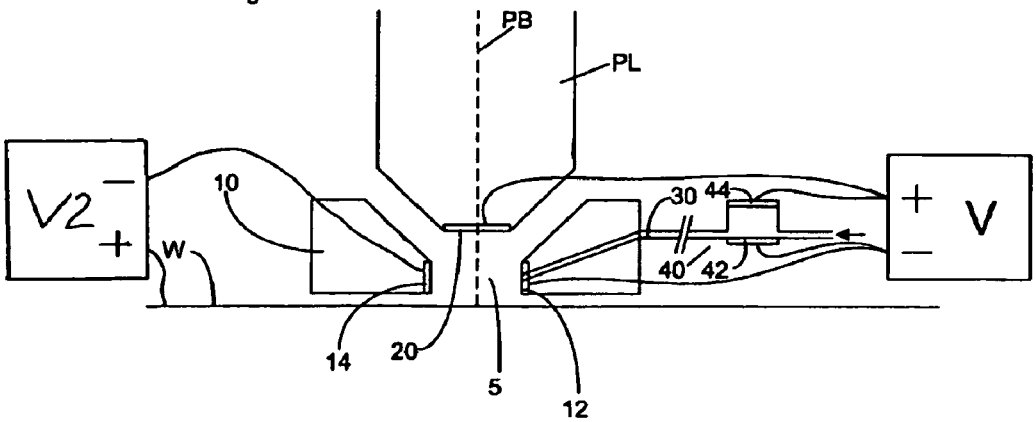
FIG. 5 illustrates another embodiment of the present invention.

In FIG. 5, a second power source/voltage supply/charge/voltage/electrical field or potential difference generator or supply V2 is provided. The second power source V2 supplies or generates a second electrical potential that is opposite in polarity to the electrical potential supplied or generated by the power source V. The second electrical potential may be of the same polarity as the electrokinetic potential of a surface of the bubbles and/or particles in the immersion liquid. Although the power source V is shown as applying the electrical potential to objects 12, 20, 42, 44 and the second power source V2 is shown as applying the second electrical potential to objects W, 14, it should be appreciated that the first and second power sources V, V2 may apply the electrical potentials to the objects in any combination.

While specific embodiments of the invention have been described above, it will be appreciated that the invention may be practiced otherwise than as described. The description is not intended to limit the invention.

What is claimed is:

1. A lithographic apparatus, comprising:

an illumination system configured to provide a projection beam of radiation;

a support configured to support a patterning structure which is configured to impart the projection beam with a pattern in its cross-section;

a substrate table configured to hold a substrate;

a projection system configured to project the patterned beam onto a target portion of the substrate;

a liquid supply system configured to at least partly fill a space between the projection system and the substrate with an immersion liquid; and a power source configured to apply a first electrical potential across the immersion liquid supplied by the liquid supply system to move at least one of bubbles and particles, when in the space, in the immersion liquid.

2. An apparatus according to claim 1, wherein the first electrical potential is applied to a first object.

3. An apparatus according to claim 2, wherein the first object is in contact with the immersion liquid.

4. An apparatus according to claim 2, wherein the first object forms a border of the space.

5. An apparatus according to claim 2, wherein the first object is in contact with the immersion liquid in a supply channel upstream of the space.

6. An apparatus according to claim 2, wherein the first object is the substrate.

7. An apparatus according to claim 2, wherein the first object lies in the optical axis of the apparatus.

8. An apparatus according to claim 2, wherein the first object [fonns] *forms* a border of the space and is positioned distal from the optical axis of the apparatus.

9. An apparatus according to claim 2, wherein the first object is positioned on a barrier member which extends along at least a part of a boundary of the space.

10. An apparatus according to claim 1, wherein the first electrical potential is applied across the immersion liquid in the space.

11. An apparatus according to claim 1, wherein the first electrical potential is applied across the immersion liquid outside the space.

12. An apparatus according to claim 11, wherein the first electrical potential is applied across the immersion liquid in the liquid supply system.

13. An apparatus according to claim 1, wherein the first electrical potential is effective to exert a force on at least one of bubbles and particles in the immersion liquid in a direction away from the substrate.

14. An apparatus according to claim 1, further comprising a second power source configured to apply a second electrical potential across the immersion liquid.

15. An apparatus according to claim 14, wherein the second electrical potential is opposite in polarity to the first electrical potential.

16. An apparatus according to claim 14, wherein the second electrical potential is of the same polarity as an electrokinetic potential of a surface of at least one of bubbles and particles in the immersion liquid.

17. An apparatus according to claim 14, wherein the second electrical potential is applied across the immersion liquid in the space.

18. An apparatus according to claim 14, wherein the second electrical potential is applied across the immersion fluid outside the space.

19. An apparatus according to claim 14, wherein the second electrical potential is applied to a second object.

20. An apparatus according to claim 19, wherein the second object forms a border of the space.

21. An apparatus according to claim 19, wherein the second object is in contact with the immersion liquid in a supply channel upstream of the space.

22. An apparatus according to claim 19, wherein the second object is a final element of the projection system.

23. An apparatus according to claim 1, wherein the first electrical potential is effective to exert a force on at least one of bubbles and particles in the immersion liquid in a direction such that when in the space, the at least one of bubbles and particles will be further from the substrate than if no electrical potential was applied across the immersion liquid.

24. An apparatus according to claim 1, wherein the first electrical potential is between ±5 mV and ±5V.

25. An apparatus according to claim 1, wherein the first electrical potential is between 10 mV and 500 mV.

26. An apparatus according to claim 1, wherein the first electrical potential is effective to set up an electrical field of up to 500 mV/mm.

27. An apparatus according to claim 1, wherein the first electrical potential is of different polarity to an electrokinetic potential of a surface of at least one of bubbles and particles in the immersion liquid.

28. A lithographic apparatus, comprising:

a support configured to support a patterning structure which is configured to impart a beam of radiation with a pattern in its cross-section;

a substrate table configured to hold a substrate;

a projection system configured to project the patterned beam onto a target portion of the substrate;

a liquid supply system configured to at least partly fill a space between the projection system and the substrate with an immersion liquid; and the liquid supply system having means for moving at least one of bubbles and particles, when in the space, in the immersion liquid supplied by the liquid supply system by the application of a voltage *to the immersion liquid, the bubbles and/or the particles*.

29. A lithographic apparatus, comprising:

a support configured to support a patterning structure configured to impart a beam of radiation with a pattern in its cross-section;

a substrate table configured to hold a substrate;

a projection system configured to project the patterned beam onto a target portion of the substrate;

a liquid supply system configured to at least partly fill a space between the projection system and the substrate with an immersion liquid, wherein the liquid supply system comprises means for applying a charge to an object, the charge being the same or opposite in polarity to an electrokinetic potential of bubbles in the immersion liquid such that at least one of bubbles and particles, when in the space, in the immersion liquid supplied by the liquid supply system have a force on them in a direction away from or towards the object.

30. A lithographic apparatus, comprising:

a support configured to support a patterning structure which is configured to impart a beam of radiation with a pattern in its cross-section;

a substrate table configured to hold a substrate;

a projection system configured to project the patterned beam onto a target portion of the substrate;

a liquid supply system configured to at least partly fill a space between the projection system and the substrate with an immersion liquid;

the liquid supply system having a potential field generator configured to generate an electrical field in the immersion liquid effective to move at least one of bubbles and particles, when in the space, in the immersion liquid supplied by the liquid supply system.

31. A device manufacturing method, comprising:

projecting a patterned beam of radiation onto a target portion of a substrate using a projection system;

providing an immersion liquid from a liquid supply system to the space between the projection system and the substrate; and applying a force on at least one of bubbles and particles, when in the space, in the immersion liquid provided by the liquid supply system by applying a charge to an object.

32. A method according to claim 31, wherein the object forms a border of the space.

33. A method according to claim 31, wherein the object is in contact with the immersion liquid in a supply channel upstream of the space.

*34. A lithographic apparatus, comprising:*

*a substrate table configured to hold a substrate;*

*a projection system configured to project a patterned beam onto a target portion of the substrate;*

*a liquid supply system configured to at least partly fill a space between the projection system and the substrate with an immersion liquid; and*

*a force applicator constructed and arranged to move particles, when in the space, in the immersion liquid independent of the flow or pressure of the immersion liquid, the particles being of different material than the immersion liquid.*

*35. An apparatus according to claim 34, wherein the force applicator is constructed and arranged to move the particles (i) away from the substrate, or (ii) from an optical axis of the projection system, or (iii) towards a final optical element of the projection system, or (iv) towards a liquid confinement structure, or (v) towards an object close to a final optical element of the projection system, or (vi) any combination selected from (i)-(v).*

*36. An apparatus according to claim 34, wherein the force applicator comprises a power source.*

*37. An apparatus according to claim 36, wherein the power source is configured to apply a first electrical potential across the immersion liquid.*

*38. An apparatus according to claim 37, wherein the first electrical potential is applied to a first object.*

*39. An apparatus according to claim 38, wherein the first object is in contact with the immersion liquid.*

*40. An apparatus according to claim 38, wherein the first object forms a border of the space.*

*41. An apparatus according to claim 38, wherein the first object is in contact with the immersion liquid in a supply channel upstream of the space.*

*42. An apparatus according to claim 34, further comprising an illumination system configured to provide a projection beam of radiation.*

*43. An apparatus according to claim 34, further comprising a support configured to support a patterning structure, the patterning structure configured to impart a projection beam with a pattern in its cross-section.*

*44. A lithographic apparatus, comprising:*

*a substrate table configured to hold a substrate;*

*a projection system configured to project a patterned beam onto a target portion of the substrate;*

*a liquid supply system configured to at least partly fill a space between the projection system and the substrate with an immersion liquid; and*

*a force applicator constructed and arranged to move particles in the immersion liquid independent of the flow or pressure of the immersion liquid and from the substrate, from an optical axis of the projection system, or from both the substrate and the optical axis, the particles being of different material than the immersion liquid.*

*45. A lithographic apparatus, comprising:*

*a substrate table configured to hold a substrate;*

*a projection system configured to project a patterned beam onto a target portion of the substrate;*

*a liquid supply system configured to at least partly fill a space between the projection system and the substrate with an immersion liquid; and*

*a force applicator constructed and arranged in a supply channel upstream of the space to move particles, when in the space, in the immersion liquid independent of the flow or pressure of the immersion liquid, the particles being of different material than the immersion liquid.*

* * * * *

UNITED STATES PATENT AND TRADEMARK OFFICE

CERTIFICATE OF CORRECTION

PATENT NO. : RE42,849 E
APPLICATION NO. : 12/153717
DATED : October 18, 2011
INVENTOR(S) : Duineveld et al.

It is certified that error appears in the above-identified patent and that said Letters Patent is hereby corrected as shown below:

On the Title Page:

Item [64], Replace sub-heading, PCT Filed: with sub-heading, Filed.

Signed and Sealed this
First Day of November, 2011

David J. Kappos

David J. Kappos
*Director of the United States Patent and Trademark Office*